US009785822B2

(12) United States Patent
Lee et al.

(10) Patent No.: US 9,785,822 B2
(45) Date of Patent: Oct. 10, 2017

(54) BIOMETRIC RECOGNITION APPARATUS WITH REFLECTION-SHIELDING ELECTRODE

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 51 days.

(21) Appl. No.: 15/147,502

(22) Filed: May 5, 2016

(65) Prior Publication Data

US 2016/0342824 A1 Nov. 24, 2016

(30) Foreign Application Priority Data

May 21, 2015 (TW) .............................. 104116342 A

(51) Int. Cl.
| | |
|---|---|
| G06K 9/00 | (2006.01) |
| H05K 1/02 | (2006.01) |
| H03K 17/96 | (2006.01) |

(52) U.S. Cl.
CPC ....... *G06K 9/0002* (2013.01); *H03K 17/9622* (2013.01); *H05K 1/0274* (2013.01);
(Continued)

(58) Field of Classification Search
USPC ........................................................ 382/124
See application file for complete search history.

(56) References Cited

U.S. PATENT DOCUMENTS

| 7,864,992 B2 | 1/2011 | Riedijk et al. | |
|---|---|---|---|
| 2014/0103941 A1* | 4/2014 | Chou ...................... | G06F 3/044 324/658 |

(Continued)

FOREIGN PATENT DOCUMENTS

| CN | 104077572 A | 10/2014 |
|---|---|---|
| TW | I390452 B | 3/2013 |

(Continued)

OTHER PUBLICATIONS

Office Action dated Dec. 18, 2015 of the corresponding Taiwan patent application.

*Primary Examiner* — Jerome Grant, II
(74) *Attorney, Agent, or Firm* — Chun-Ming Shih; HDLS IPR Services

(57) ABSTRACT

A biometric recognition apparatus with reflection-shielding electrode includes a substrate, a sensing electrode layer arranged on one side of the substrate, the sensing electrode layer including a plurality of sensing electrodes and at least one suppressing electrode. The biometric recognition apparatus further includes a plurality of selection switches and conductive wires, at least a part of the selection switches and the conductive wires are electrically connected to the sensing electrodes. The biometric recognition apparatus further includes a reflection-shielding electrode layer with at least one reflection-shielding electrode and arranged on one side of the sensing electrode layer. By incorporating the reflection-shielding electrode and the suppressing electrode, the sensing sensibility and signal to noise ration can be enhanced, thus increasing the sensing distance between sensing electrode and user finger.

20 Claims, 13 Drawing Sheets

(52) U.S. Cl.
CPC . *H05K 1/0296* (2013.01); *H03K 2217/96023* (2013.01); *H03K 2217/960765* (2013.01)

(56) References Cited

U.S. PATENT DOCUMENTS

| | | | |
|---|---|---|---|
| 2014/0140588 A1* | 5/2014 | Chou | G06K 9/0002 |
| | | | 382/124 |
| 2016/0283769 A1* | 9/2016 | Lee | G06K 9/00026 |
| 2016/0314332 A1* | 10/2016 | Lee | G06K 9/0002 |
| 2016/0342824 A1* | 11/2016 | Lee | G06K 9/0002 |
| 2017/0076130 A1* | 3/2017 | Kravets | G06K 9/0002 |
| 2017/0160863 A1* | 6/2017 | Suzuki | G06F 3/0416 |

FOREIGN PATENT DOCUMENTS

| | | |
|---|---|---|
| TW | 201447711 A | 12/2014 |
| TW | M508114 U | 9/2015 |

\* cited by examiner

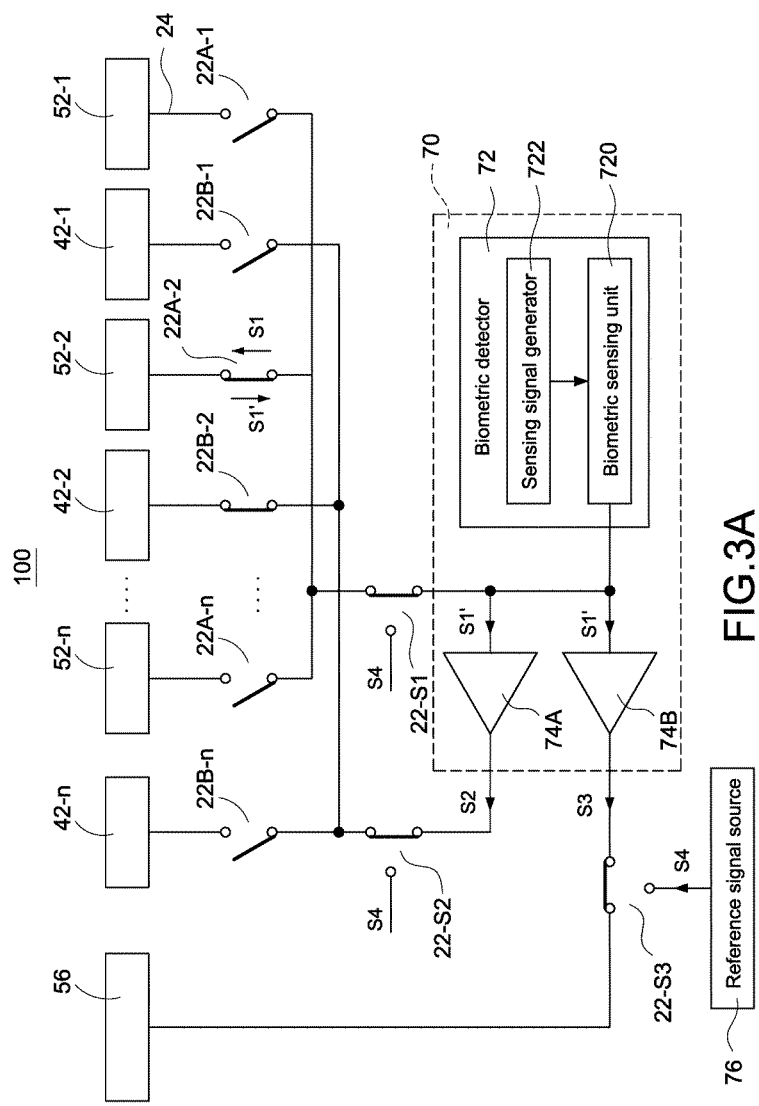

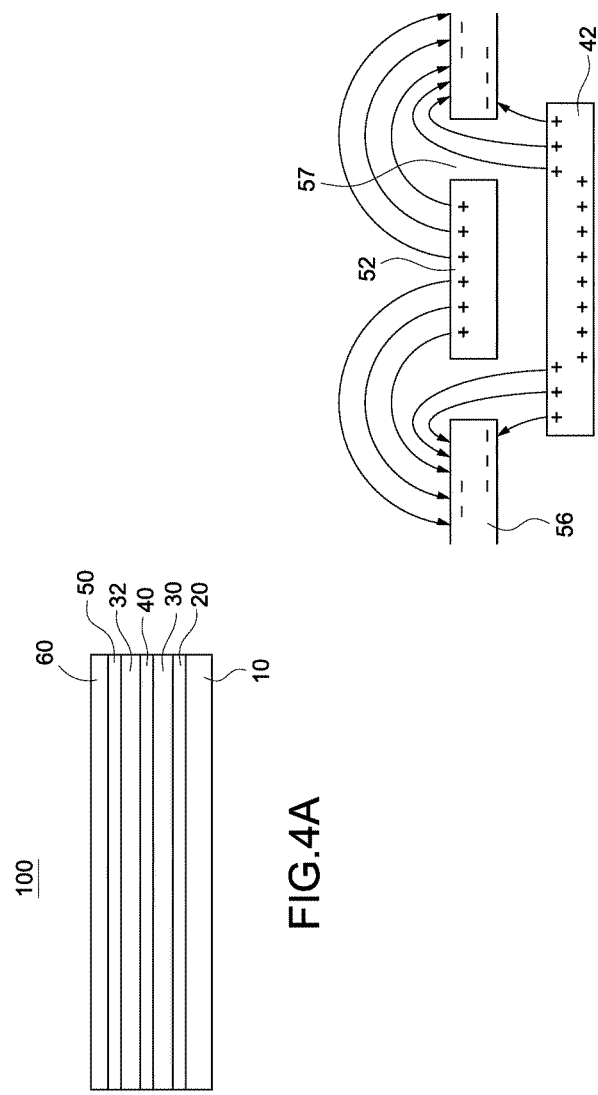

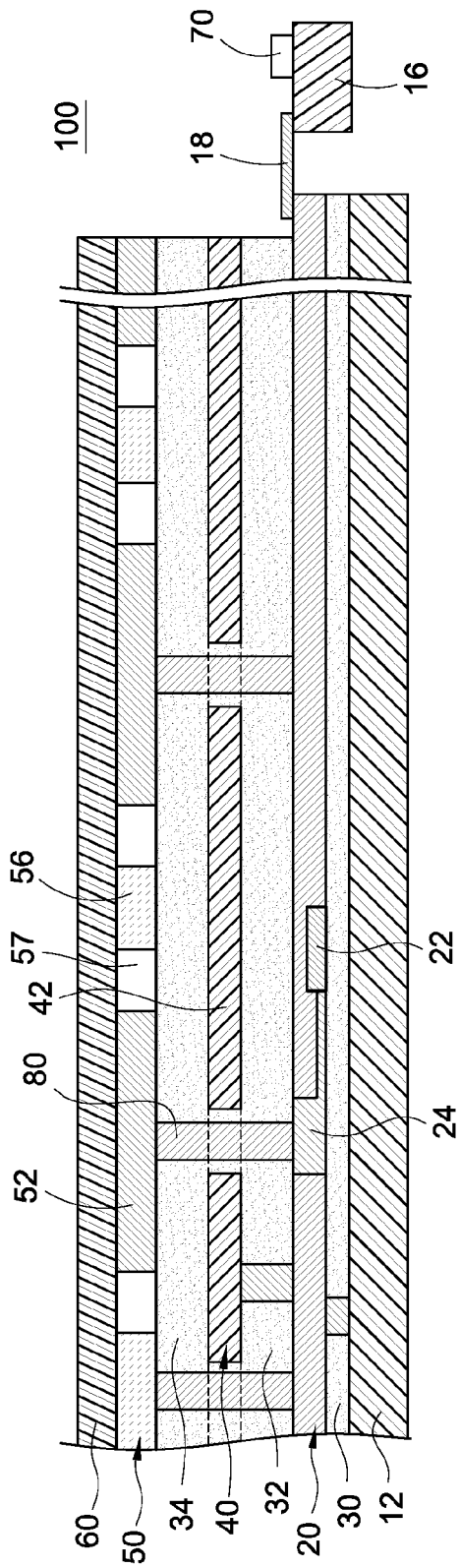
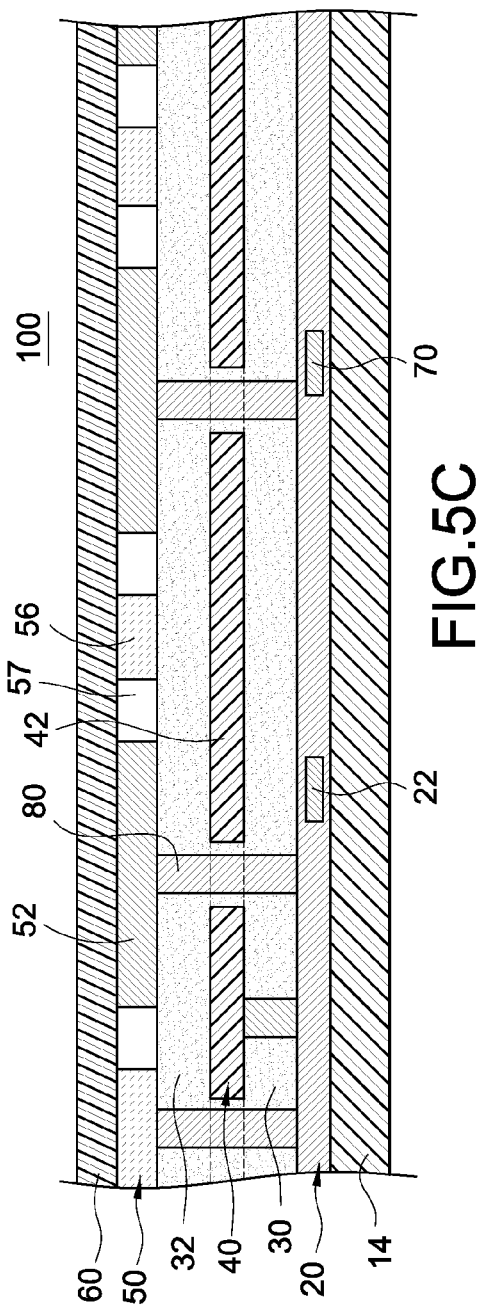
FIG.5B
FIG.5C

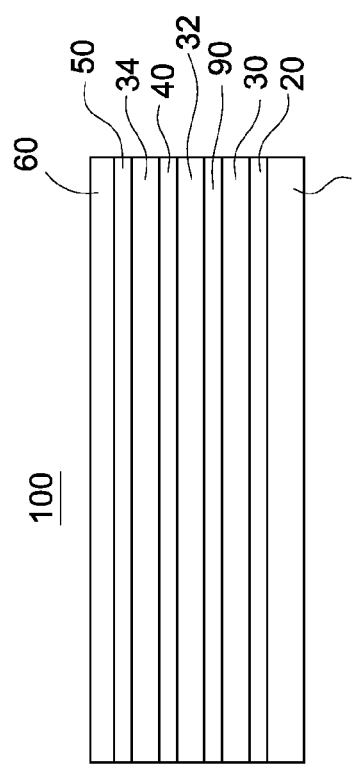
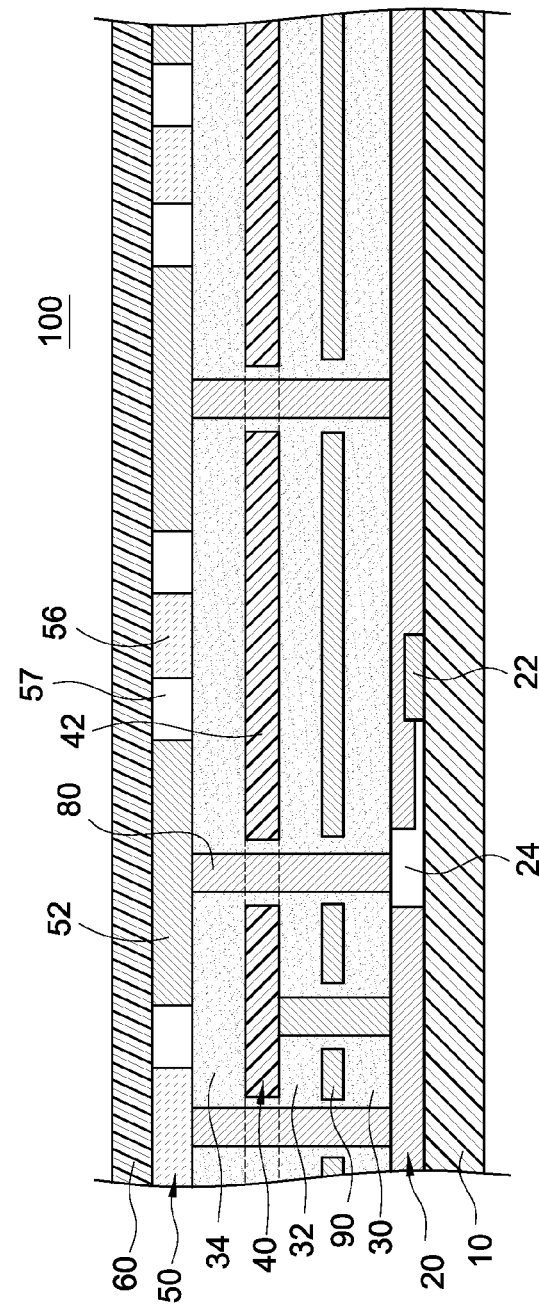

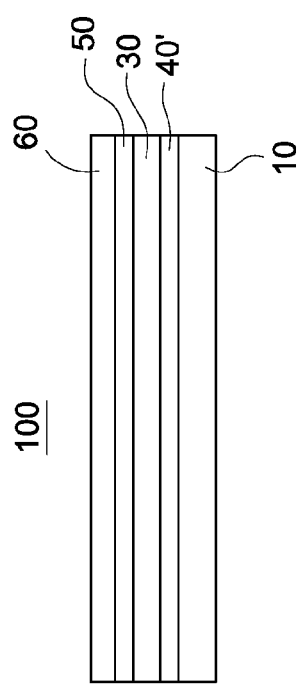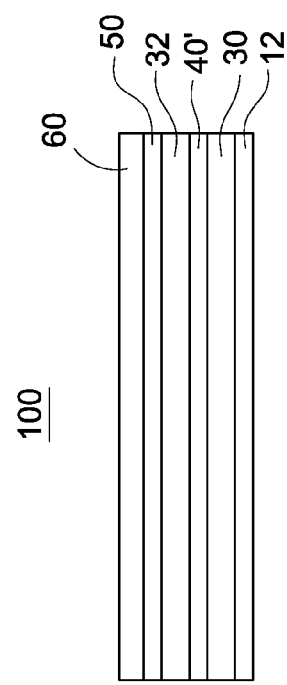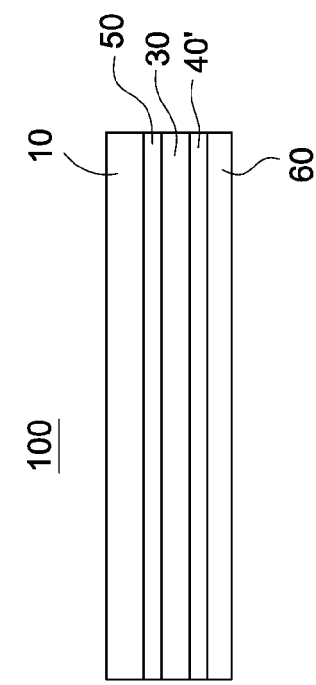
FIG.7A
FIG.7B
FIG.7C

BIOMETRIC RECOGNITION APPARATUS WITH REFLECTION-SHIELDING ELECTRODE

BACKGROUND OF THE INVENTION

Field of the Invention

The present invention relates to a biometric recognition apparatus, especially to a biometric recognition apparatus with reflection-shielding electrode.

Description of Prior Art

Biometric recognition technology has been widely applied to personal identification and authentication. The conventional biometric recognition technologies can be classified into fingerprint recognition, iris recognition or DNA recognition and so on. Due to safety, non-invasiveness and efficiency considerations, fingerprint recognition becomes main stream technology. The fingerprint recognition device can scan fingerprint image by optical scanning, thermal imaging, supersonic imaging or capacitive imaging. For compactness, cost, power-saving, reliability and security concerns, the capacitive fingerprint sensor becomes popular for biometric recognition technology applied to portable electronic devices.

The conventional capacitive fingerprint sensors can be classified into swipe type and area type (pressing type), and the area type has better identification correctness, efficiency and convenience. However, the area type capacitive fingerprint sensor generally integrates the sensing electrodes and the sensing circuit into one integrated circuit (IC) protected by a sapphire film with thickness below 100 um because the sensed signals are minute and the background noise is huge in comparison with the minute sensed signals. As a result, the material cost and package cost is high and the product lifetime and durability are influenced. It is a development trend to enhance the sensing ability and signal-to-noise ratio for the sensing circuit such that distance between the sensing electrode and user finger can be increased and the package of the sensing IC can be simplified. It is also desirable to integrate the sensing electrode to location below the protection glass or even more desirable to integrate the sensing electrode into the display panel, thus greatly reducing cost and enhancing product lifetime and durability.

SUMMARY OF THE INVENTION

It is an object of the present invention to provide a biometric recognition apparatus to overcome above mentioned problems.

Accordingly, the present invention provides a biometric recognition apparatus with reflection-shielding electrode, comprising: a substrate; a sensing electrode layer arranged on one side of the substrate, the sensing electrode layer comprising a plurality of sensing electrodes and at least one suppressing electrode; a plurality of selection switches and conductive wires, at least a part of the selection switches and a part of the conductive wires electrically connected to the corresponding sensing electrodes; a reflection-shielding electrode layer arranged on one side of the sensing electrode layer, the reflection-shielding electrode layer having at least one reflection-shielding electrode.

Accordingly, the present invention provides a sensing method for a biometric recognition apparatus, the biometric recognition apparatus comprising a plurality of sensing electrodes, at least one suppressing electrode, at least one reflection-shielding electrode, a plurality of selection switches and at least one signal processing circuit, the method comprising: controlling the selection switches to sequentially or randomly set at least one of the sensing electrode as a detecting electrode; generating a periodic or non-periodic fingerprint sensing signal and sending the fingerprint sensing signal to the selected detecting electrode to generate a sensed signal; using the signal processing circuit to process the sensed signal into a reflection-deflection signal having a same phase with the sensed signal and coupling the reflection-deflection signal to the at least one reflection-shielding electrode; and coupling a suppressing signal to the suppressing electrode.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

FIG. 3A is a schematic view showing the measurement operation of the biometric recognition apparatus according to an embodiment of the present invention.

FIG. 4A shows the sectional view of the layered structure for the biometric recognition apparatus according to the present invention.

FIG. 4B is a sectional view showing the function of the reflection-shielding electrode layer for the biometric recognition apparatus according to the present invention.

FIGS. 5A-5C show the detailed sectional views of the biometric recognition apparatus according to other embodiments of the present invention, FIG. 6A shows the sectional view of the biometric recognition apparatus according to another embodiment of the present invention.

FIG. 6B is a more detailed sectional view for embodiment in FIG. 6A.

FIGS. 7A-7C show the schematic sectional views of the biometric recognition apparatus according to other embodiments of the present invention.

DETAILED DESCRIPTION OF THE INVENTION

Figure 1B:
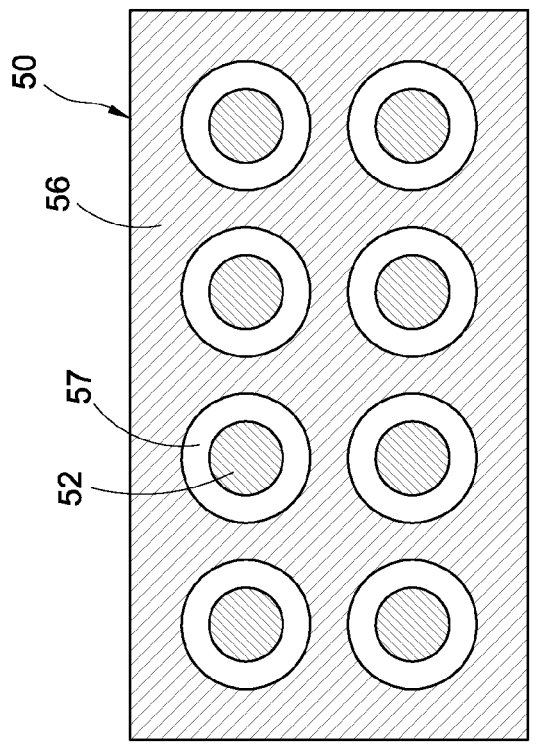
FIG. 1B is a top view showing the multi-function electrode layer in the biometric recognition apparatus according to another embodiment of the present invention.
Figure 1A:
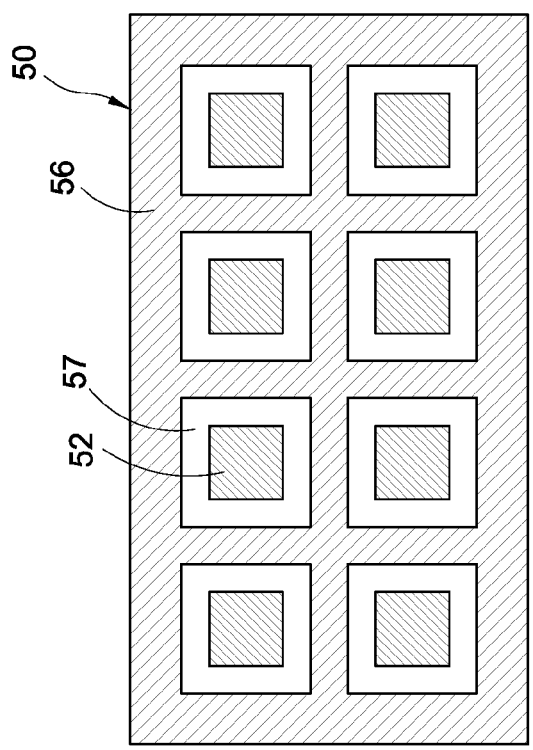
FIG. 1A is a top view showing the multi-function electrode layer in the biometric recognition apparatus according to an embodiment of the present invention.

FIG. 1A is a top view showing the sensing electrode layer 50 in the biometric recognition apparatus 100 according to an embodiment of the present invention. The sensing electrode layer 50 comprises a plurality of sensing electrodes 52 and at least one suppressing electrode 56. As shown in FIG. 1A, the suppressing electrode 56 at least partially surrounds one of the sensing electrodes 52 (for example, completely surrounds one of the sensing electrodes 52) and electrically isolates with the sensing electrodes 52 to enhance sensing sensibility and signal-to-noise ratio. According to one embodiment, the sensing electrode 52 may be of rectangular shape and the suppressing electrode 56 also has rectangular-strip shaped gap 57 therebetween. According to another embodiment, the sensing electrode 52 may be of circular shape and the suppressing electrode 56 also has circular-strip shaped gap 57 therebetween. Besides, the sensing electrode 52 may be of other shapes such as triangular, square, oblong, rhombic or polygonal.

Figure 2B:
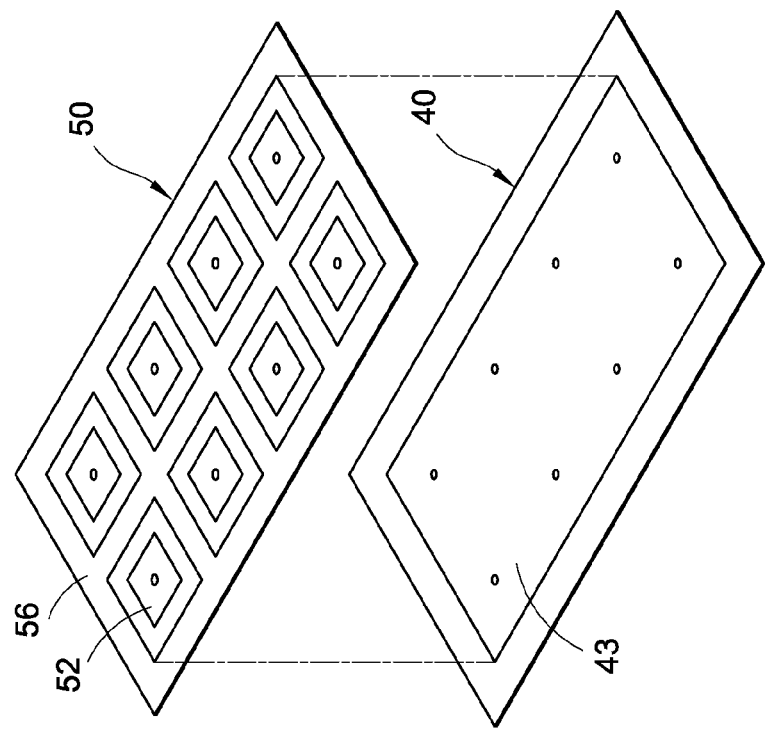
FIG. 2B is a perspective view of the sensing electrode layer and the reflection-shielding electrode layer according to another embodiment of the present invention.
Figure 2A:
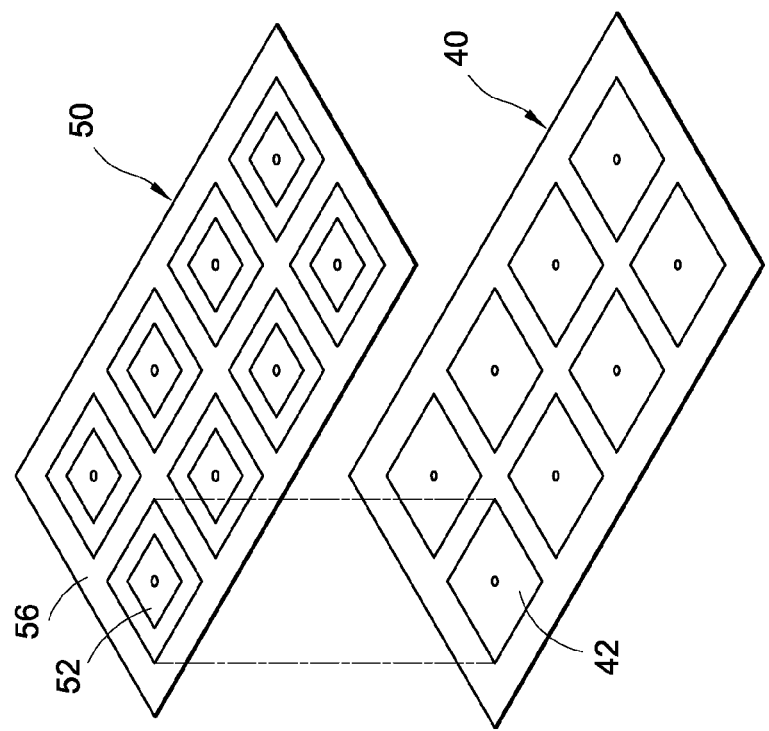
FIG. 2A is a perspective view of the sensing electrode layer and the reflection-shielding electrode layer according to an embodiment of the present invention.

FIG. 2A is a perspective view of the sensing electrode layer 50 and the reflection-shielding electrode layer 40. The sensing electrode layer 50 comprises a plurality of rectangular sensing electrodes 52 and at least one suppressing electrode 56 as those shown in FIG. 1A. The reflection-shielding electrode layer 40 is placed below the sensing electrode layer 50 and has a plurality of reflection-shielding electrodes 42. As shown in FIG. 2A, each of the reflection-shielding electrodes 42 is corresponding to one sensing electrode 52 and is substantially of rectangular shape. However, each of the reflection-shielding electrodes 42 may have arbitrary shape as long as it can encompass the projection of the corresponding sensing electrode 52 onto the reflection-shielding electrode layer 40. Moreover, each of the reflection-shielding electrodes 42 preferably has area larger than the area of the corresponding sensing electrode 52 plus the area of the corresponding gap 57. FIG. 2B is a perspective view of the sensing electrode layer 50 and the reflection-shielding electrode layer 40 according to another embodiment of the present invention. The reflection-shielding electrode layer 40 has a one-piece reflection-shielding electrode 43. The one-piece reflection-shielding electrode 43 may have arbitrary shape as long as it can encompass the projection of all sensing electrodes 52 onto the reflection-shielding electrode layer 40. According to another embodiment of the present invention, the reflection-shielding electrodes 42 (or the one-piece reflection-shielding electrode 43) do not need the above mentioned encompassing requirement as long as the electric flux lines from reflection-shielding electrodes 42 (or the one-piece reflection-shielding electrode 43) can leak from the gap 57 between the sensing electrode 52 and the suppressing electrode 56, as shown in FIG. 4B.

FIG. 3A is a schematic view showing the measurement operation of the biometric recognition apparatus 100 according to an embodiment of the present invention, where this embodiment is corresponding to the arrangement of reflection-shielding electrodes 42 shown in FIG. 2A, namely, the reflection-shielding electrode layer 40 has a plurality of reflection-shielding electrodes 42_1~42_n. The sensing electrodes 52_1~52_n electrically and respectively connects with corresponding one of the selection switches 22A_1~22A_n (the first set of selection switches) through the conductive wires 24 and then electrically connect with the biometric controller 70. The reflection-shielding electrodes 42_1~42_n electrically and respectively connects with corresponding one of the selection switches 22B_1~22B_n (the second set of selection switches) through the conductive wires 24 and then electrically connect with the biometric controller 70. The biometric controller 70 is preferably self-capacitance sensing circuit. The biometric controller 70 comprises a biometric detector 72, a first signal processing circuit (such as a non-inverting amplifier) 74A and a second signal processing circuit (such as an inverting amplifier) 74B. The biometric detector 72 further comprises a biometric sensing unit 720 and a sensing signal generator 722. The biometric controller 70 selects one of the sensing electrodes 52 (such as the sensing electrode 52_2 shown in FIG. 3A) by controlling the selection switches 22, and selects a corresponding one of the reflection-shielding electrodes 42 (such as the reflection-shielding electrode 42_2 shown in FIG. 3A) by controlling the selection switches 22. The sensing signal generator 722 generates a fingerprint sensing signal S1, which can be a periodic sensing signal or a non-periodic sensing signal, and then sends the signal to the sensing electrode 52_2 through the corresponding selection switch 22_2. The biometric sensing unit 720 receives the sensed signal S1' from the sensing electrode 52_2 and sends the sensed signal S1' to the first signal processing circuit (such as a non-inverting amplifier) 74A for processing the sensed signal S1' into a reflection-deflection signal S2. The reflection-deflection signal S2 is then sent to the corresponding reflection-shielding electrode 42_2. According to one embodiment, the sensed signal S1' is processed by the second signal processing circuit (such as an inverting amplifier) 74B into a suppressing signal S3, and then the suppressing signal S3 is sent to the suppressing electrode 56. Namely, the sensing signal S1' sensed by the selected sensing electrode 52_2 and the reflection-deflection signal S2 sent to the corresponding reflection-shielding electrode 42_2 can be of the same phase (for example both of them are positive valued signals), while the suppressing signal S3 sent to the suppressing electrode 56 are of inverted phase with the sensed signal S1' and the deflection signal S2 (for example, the suppressing signal S3 is negative valued signal). With reference again to FIG. 4B, a positive voltage is applied to the selected sensing electrode 52, positive voltages are applied to the corresponding reflection-shielding electrode 42 while negative voltage are applied to the suppressing electrode 56. The electric flux lines will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. Besides, the sensing signal generator 722 can also generate periodic signal, non-periodic signal, symmetric or asymmetric signal, wherein the periodic signal can be sinusoid wave, square wave or triangular wave.

According to another embodiment, the suppressing electrode 56 may receive a predetermined-level signal S4 output by a reference signal source 76 through the selection switch 22_S3, where the predetermined-level signal S4 has smaller magnitude than that of the sensed signal S1'. Similarly, the sensed signal S1' sensed by the selected sensing electrode 52_2 and the reflection-deflection signal S2 sent to corresponding reflection-shielding electrode 42_2 can be of the same phase (for example both of them are positive valued signals with larger magnitude), while the suppressing signal S3 sent to the suppressing electrode 56 is also of the same phase with the sensing signal S1' and the reflection-deflection signal S2 but with smaller magnitude (for example, the suppressing signal S3 is positive valued signal with smaller magnitude). With reference again to FIG. 4B, a positive voltage with larger magnitude is applied to the selected sensing electrode 52; positive voltages with larger magnitude are applied to the reflection-shielding electrodes 42 while positive voltage with smaller magnitude is applied to the suppressing electrode 56. Similarly, the electric flux lines will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. Moreover, the biometric controller 70 can also send the predetermined-level signal S4 to all sensing electrodes 52 (or selected sensing electrode 52), the reflection-shielding electrodes 42 and the suppressing electrode 56 through the selection switches 22_S1~22_S3, where the predetermined-level signal S4 may be positive level signal, negative level signal, zero level signal or alternating signal.

Figure 3B:
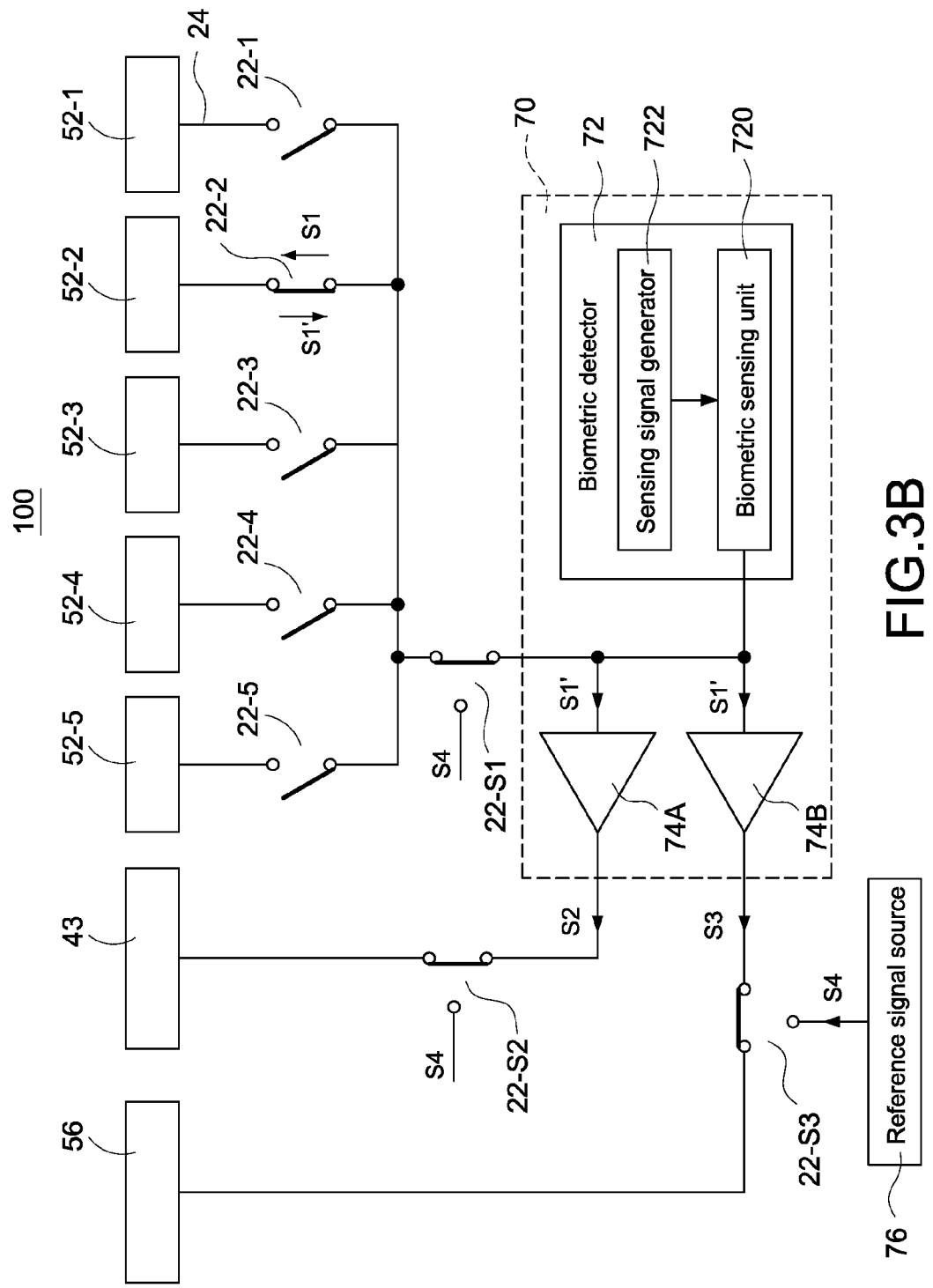
FIG. 3B is a schematic view showing the measurement operation of the biometric recognition apparatus according to another embodiment of the present invention.

FIG. 3B is a schematic view showing the measurement operation of the biometric recognition apparatus 100 according to another embodiment of the present invention, where this embodiment is corresponding to the arrangement of the one-piece reflection-shielding electrode 43 shown in FIG. 2B. The sensing electrodes 52_1~52_5 electrically and respectively connects with corresponding one of the selection switches 22_1~22_5 through the conductive wires 24 and then electrically connect with the biometric controller 70. The one-piece reflection-shielding electrode 43 electrically connects with the biometric controller 70 through the conductive wire 24 and the selection switch 22_S2. The suppressing electrode 56 electrically connects with the biometric controller 70 through the conductive wire 24 and the selection switch 22_S3. Similarly, the biometric controller 70 comprises a biometric detector 72, a first signal processing circuit (such as a non-inverting amplifier) 74A and a second signal processing circuit (such as an inverting amplifier) 74B. The biometric detector 72 further comprises a biometric sensing unit 720 and a sensing signal generator 722. The biometric controller 70 selects one of the sensing electrodes 52 (such as the sensing electrode 52_2 shown in FIG. 3B) by controlling the selection switches 22. The sensing signal generator 722 generates a fingerprint sensing signal S1, which can be a periodic sensing signal or a non-periodic sensing signal, and then sends the signal to the sensing electrode 52_2 through the corresponding selection switch 22_2. The biometric sensing unit 720 receives the sensed signal S1' from the sensing electrode 52_2 and sends the sensed signal S1' to the first signal processing circuit (such as a non-inverting amplifier) 74A for processing the sensed signal S1' into a reflection-deflection signal S2. The reflection-deflection signal S2 is then sent to the one-piece reflection-shielding electrode 43. According to one embodiment, the sensed signal S1' is processed by the second signal processing circuit (such as an inverting amplifier) 74B into a suppressing signal S3, and then the suppressing signal S3 is sent to the suppressing electrode 56. Namely, the sensing signal S1' sensed by the selected sensing electrode 52_2 and the reflection-deflection signal S2 sent to the one-piece reflection-shielding electrode 43 can be of the same phase (for example both of them are positive valued signals), while the suppressing signal S3 sent to the suppressing electrode 56 are of inverted phase with the sensed signal S1' and the deflection signal S2 (for example, the suppressing signal S3 is negative valued signal). With reference again to FIG. 4B, a positive voltage is applied to the selected sensing electrode 52; a positive voltage is applied to the corresponding one-piece reflection-shielding electrode 43 while negative voltage is applied to the suppressing electrode 56. The electric line will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. Besides, the sensing signal generator 722 can also generate periodic signal, non-periodic signal, symmetric or asymmetric signal, wherein the periodic signal can be sinusoid wave, square wave or triangular wave.

According to another embodiment, the suppressing electrode 56 may receive a predetermined-level signal S4 output by a reference signal source 76 through the selection switch 22_S3, where the predetermined-level signal S4 has smaller magnitude than that of the sensed signal S1'. Similarly, the sensed signal S1' is processed by the first signal processing circuit (such as a non-inverting amplifier) 74A into the reflection-deflection signal S2 and the reflection-deflection signal S2 is sent to the one-piece reflection-shielding electrode 43. Therefore, the sensed signal S1' sensed by the selected sensing electrode 52_2 and the reflection-deflection signal S2 sent to the one-piece reflection-shielding electrode 43 are of the same phase (for example both of them are positive valued signals with larger magnitude), while the suppressing signal S3 sent to the suppressing electrode 56 is also of the same phase with the sensing signal S1' and the reflection-deflection signal S2 but with smaller magnitude (for example, the suppressing signal S3 is positive valued signal with smaller magnitude). With reference again to FIG. 4B, a positive voltage with larger magnitude is applied to the selected sensing electrode 52; a positive voltage with larger magnitude is applied to the one-piece reflection-shielding electrode 43 while positive voltage with smaller magnitude is applied to the suppressing electrode 56. Similarly, the electric flux lines will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. Moreover, the biometric controller 70 can also send the predetermined-level signal S4 to all sensing electrodes 52 (or selected sensing electrode 52), the one-piece reflection-shielding electrode 43 and the suppressing electrode 56 through the selection switches 22_S1~22_S3, where the predetermined-level signal S4 may be positive level signal, negative level signal, zero level signal or alternating signal.

Figure 4C:
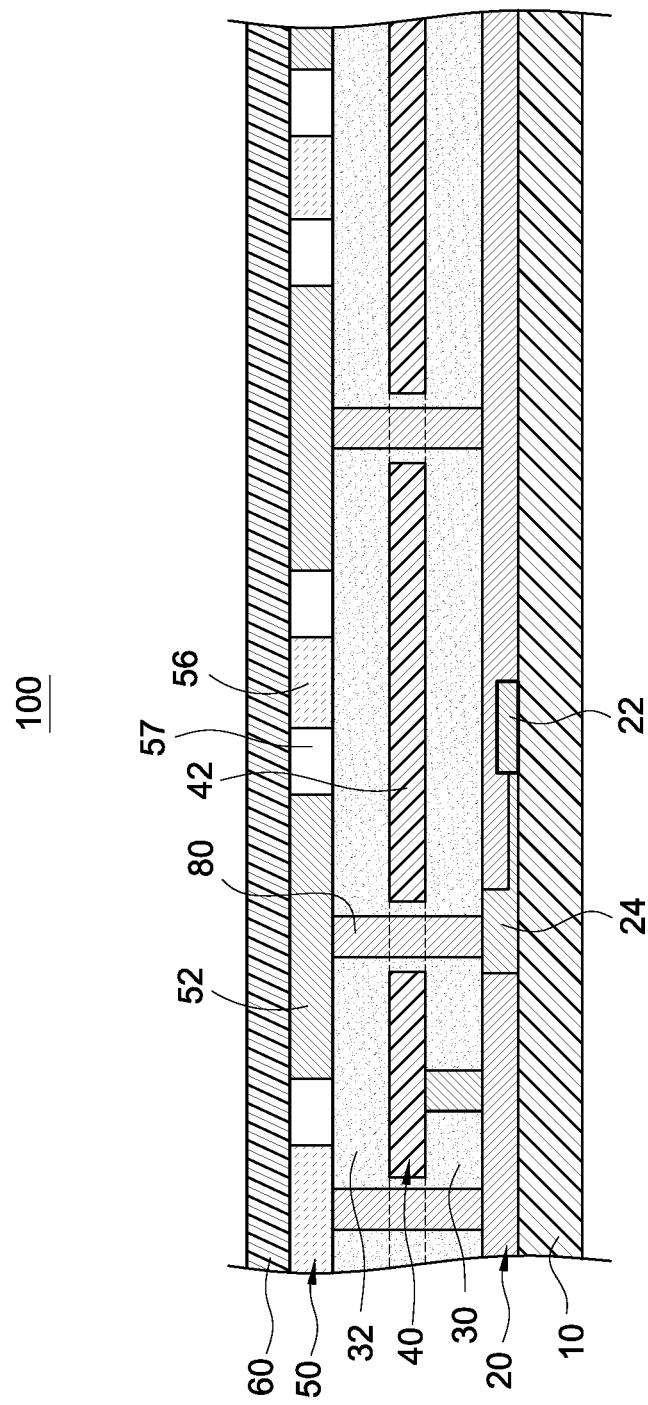
FIG. 4C shows the sectional view of the detailed structure for the biometric recognition apparatus according to the present invention.
Figure 4D:
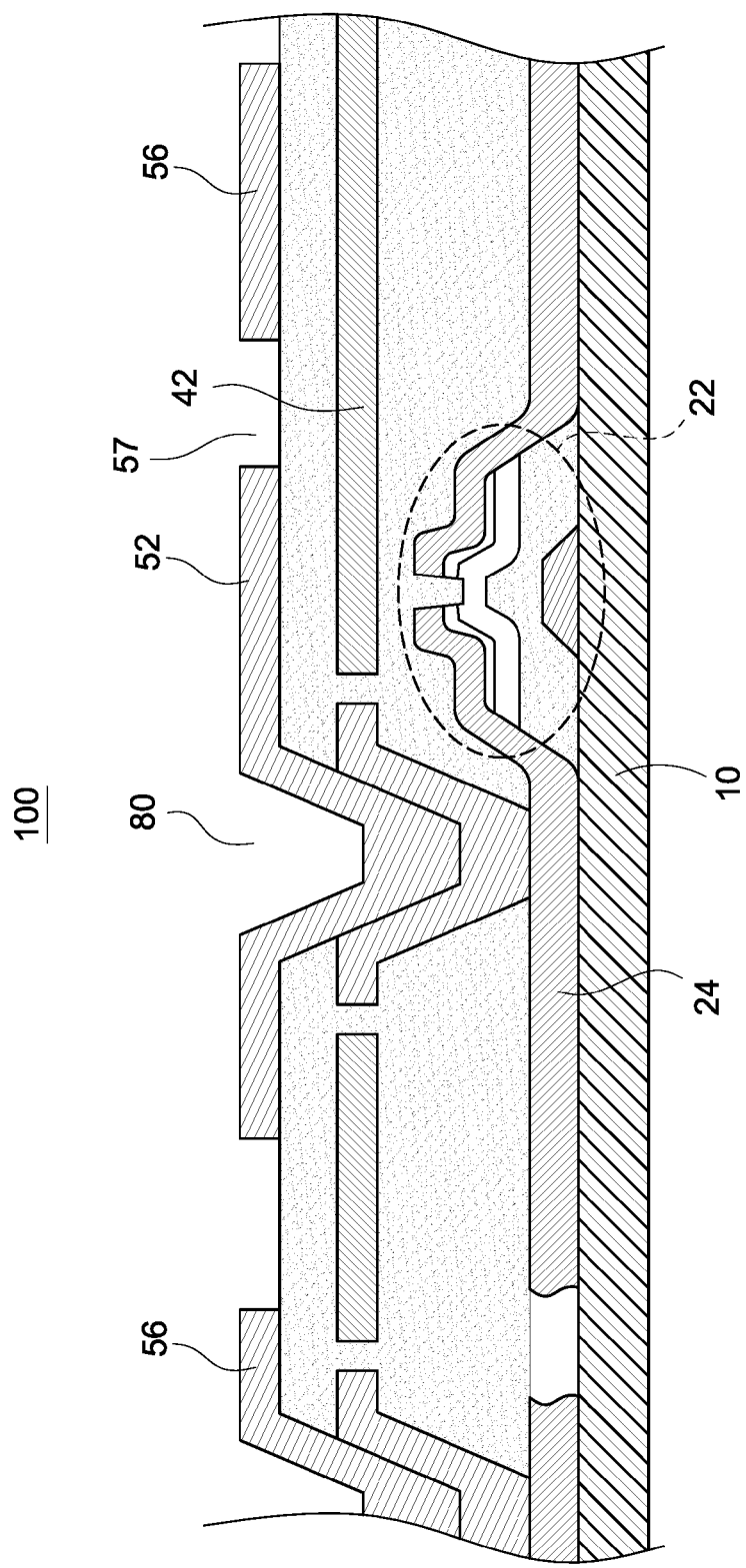
FIG. 4D shows the sectional view of the device structure for the biometric recognition apparatus according to the present invention.

FIGS. 4A to 4D show the sectional views of the layered structure for the biometric recognition apparatus, the function of the reflection-shielding electrode layer, the detailed structure for the biometric recognition apparatus, and the device structure for the biometric recognition apparatus according to the present invention, respectively. As shown in FIG. 4A, the biometric recognition apparatus 100 according to an embodiment of the present invention comprises, from bottom to top order, a substrate 10, a switching circuit layer 20, a first insulating layer 30, a reflection-shielding electrode layer 40, a second insulating layer 32, a sensing electrode layer 50 and a protection layer 60. In the shown multi-layer structure, the switching circuit layer 20 comprises a plurality of selection switches 22 and a plurality of conductive wires 24, which can be referred to those shown in FIGS. 3A and 3B. The reflection-shielding electrode layer 40 may have a plurality of reflection-shielding electrodes 42 as shown in FIG. 2A or a one-piece reflection-shielding electrode 43 as shown in FIG. 2B. The sensing electrode layer 50 may have the sensing electrodes 52 and the least one suppressing electrode 56 as shown in FIG. 1A or FIG. 1B, which may be arranged on the same plane. The switching circuit layer 20, the reflection-shielding electrode layer 40 and the sensing electrode layer 50 each has respective conductive wires and electrodes; therefore, the first insulating layer 30 and the second insulating layer 32 are arranged therebetween to provide electric isolation. With reference again to FIG. 4B, a positive voltage is applied to the selected sensing electrode 52; positive voltages are applied to the corresponding reflection-shielding electrode 42 while a negative voltage is applied to the suppressing electrode 56. The electric flux lines will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. With reference to FIG. 4C, the switching circuit layer 20 comprises a plurality of selection switches 22 and a plurality of conductive wires 24, where the conductive wires 24 electrically connect the selection switch 22 with respect to one of the sensing electrodes 52 through the via hole 80 in the insulating layers 30 and 32. Similarly, the conductive wires 24 electrically connect the selection switch 22 with respect to the suppressing electrode 56 through the via hole (not labelled) in the insulating layers 30 and 32. Similarly, the conductive wires 24 electrically connect the selection switch 22 with respect to one of reflection-shielding electrodes 42 through the via hole (not labelled) in the insulating layer 30. Moreover, as shown in FIG. 4D, the selection switch 22 may be thin film transistor (TFT) switch 22 and electrically connects with corresponding sensing electrode 52 through the corresponding conductive wire 24 and the corresponding via hole 80. Even not shown in FIG. 3D, the suppressing electrode 56 electrically connects with the corresponding TFT switch 22 through the corresponding conductive wire and the corresponding via hole. Similarly, the reflection-shielding electrode 42 also electrically connects with corresponding TFT switch 22 through the corresponding conductive wire and the corresponding via hole. In the biometric recognition apparatus 100 shown in FIGS. 4A to 4D, the sensing electrodes 52, the suppressing electrode 56 and the reflection-shielding electrode 42 can be implemented by the embodiments shown in FIGS. 1A to 2B. Moreover, the protection layer 60 can provide the function of anti-oxidation and anti-moisture.

In the embodiments shown in FIGS. 4A, 4C, and 4D, the substrate 10 may be made from glass, polymer thin film, metal, silicon or silicon compound. The metal substrate may be made from stainless steel, aluminum (Al), copper (Cu), iron (Fe), silver (Ag), tin (Sn), tungsten (W) or the alloy of above metals. The sensing electrodes 52, the deflection electrodes 54 and the suppressing electrode 56 may be made from transparent or non-transparent (opaque) conductive material. The transparent conductive material includes indium tin oxide (ITO), zinc tin oxide (ZTO), zinc oxide (ZnO), gallium zinc oxide (GZO) conductive polymer, carbon nanotube, Graphene, or silver film with thickness below 50 nm. According to one aspect of the present invention, the opaque conductive material is chromium (Cr), barium (Ba), molybdenum (Mo), aluminum (Al), silver (Ag), copper (Cu), titanium (Ti), nickel (Ni), tantalum (Ta), cobalt (Co), tungsten (W), magnesium (Mg), calcium (Ca), potassium (K), lithium (Li), indium (In), an alloy of above metals, or a composition of lithium fluoride and Al, or a composition of magnesium fluoride and Al, or a composition of lithium oxide and Al.

Figure 5A:
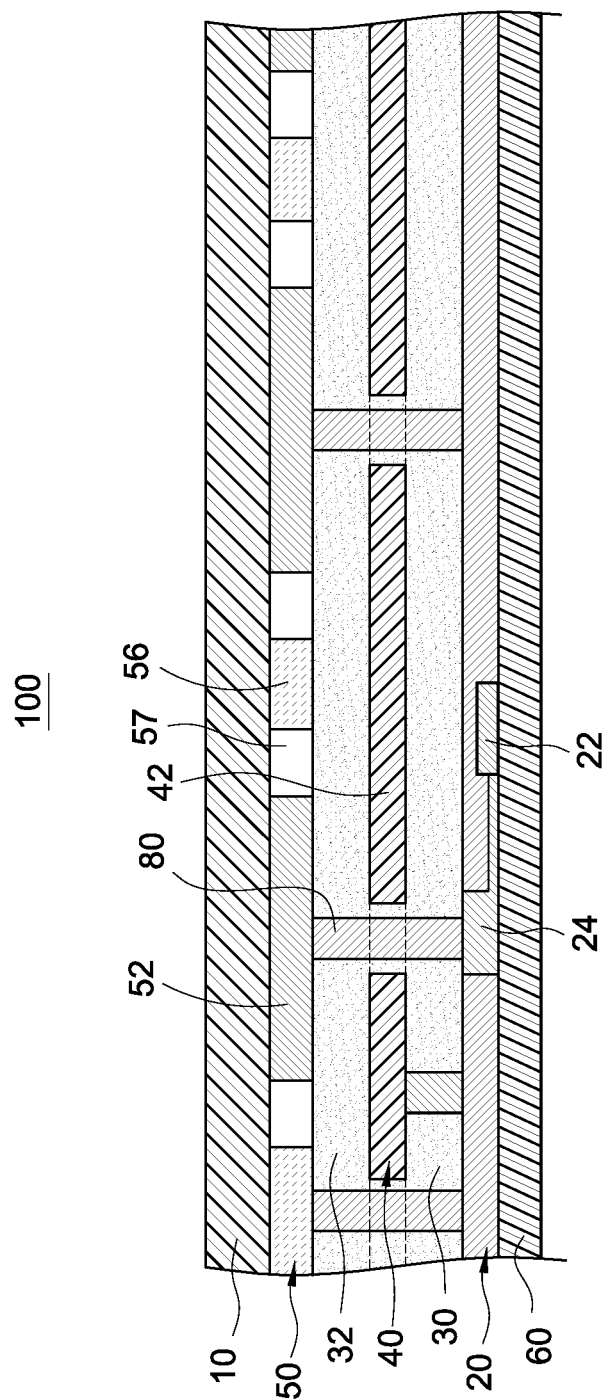

FIGS. 5A to 5C are sectional views of the biometric recognition apparatus 100 according to other embodiments of the present invention. The embodiment shown in FIG. 5A is similar to that shown in FIG. 4C and therefore uses the similar numerals as those in FIG. 4C. In comparison with the embodiment shown in FIG. 4C, the protection layer 60 in the biometric recognition apparatus 100 shown in FIG. 5A is arranged on bottommost position of the structure, while the substrate 10 is arranged on topmost position of the structure. The substrate 10 is, for example, glass substrate to provide scratchproof effect. In this embodiment, the substrate 10 may also be a polymer thin film substrate and the polymer thin film substrate is attached below the protective glass of the touch screen for biometric recognition. Moreover, the protection layer 60 has broader material choice because it does not need to have scratchproof effect. The protection layer 60 may be made from epoxy or may be an extension of the substrate of other device.

FIG. 5B shows the sectional views of the biometric recognition apparatus 100 according to another embodiment of the present invention, wherein the embodiment shown in FIG. 5B is similar to that shown in FIG. 4C and similar elements use the similar numerals. The substrate 12 in embodiment shown in FIG. 5B is metal substrate and metal substrate may be made from stainless steel, aluminum (Al), copper (Cu), iron (Fe), silver (Ag), tin (Sn), tungsten (W) or the alloy of above metals. Moreover, the biometric controller 70 may be packaged into an integrated circuit (IC) chip and the IC chip is bonded or press-welded on the metal substrate 12. As shown in FIG. 5B, the biometric controller 70 packaged in IC chip may be bonded or press-welded on a circuit board 16 and electrically connect with the conductive wires of the metal substrate 12 through circuit traces (not shown) on a flexible circuit board 18. In this embodiment, the selection switch 22 may be a TFT switch and grown on the metal substrate 12.

FIG. 5C shows the sectional views of the biometric recognition apparatus 100 according to another embodiment of the present invention, wherein the embodiment shown in FIG. 5C is similar to that shown in FIG. 4C and similar elements use the similar numerals. The substrate 14 in embodiment shown in FIG. 5C is silicon substrate and biometric controller 70 may be formed, by IC fabrication process, on the switching circuit layer 20. Therefore, the biometric recognition apparatus 100 may be formed into single IC. Moreover, the protection layer 60 may be IC packaging material such as ceramic or sapphire material. In this embodiment, the selection switch 22 may be a FET (field effect transistor) switch and grown on the silicon substrate 14.

FIG. 6A shows the sectional views of the biometric recognition apparatus 100 according to another embodiment of the present invention, and FIG. 6B is a more detailed view for FIG. 6A. The biometric recognition apparatus 100 shown in FIG. 6A is similar to that shown in FIG. 4C and therefore the similar elements use the similar numerals. The biometric recognition apparatus 100 shown in FIG. 6A further comprises a shielding electrode layer 90 between the switching circuit layer 20 and the reflection shielding electrode layer 40 to provide enhance noise-shielding effect for the conductive wires and the sensing electrode. To provide electric isolation between the switching circuit layer 20, the shielding electrode layer 90, the reflection shielding electrode layer 40 and the sensing electrode layer 50, three insulating layers 30, 32, 34 are respectively provided between two adjacent layers in above-mentioned four layers.

FIGS. 7A to 7C show the sectional views of the biometric recognition apparatus 100 according to other embodiments of the present invention. The embodiment shown in FIG. 7A is similar to that shown in FIG. 4C and similar elements use the similar numerals. In the embodiment shown in FIG. 7A, the selection switches 22 and the conductive wires 24 are fabricated on the reflection-shielding electrode layer 40' such that the layer number in the biometric recognition apparatus 100 can be reduced. Moreover, with reference again to FIGS. 2A and 4B, the reflection-shielding electrode 42 do not need to occupy the whole surface of the reflection-shielding electrode layer 40'. Therefore, the spare area (where the reflection-shielding electrode 42 are absent) of the reflection-shielding electrode layer 40' can be exploited to arrange the selection switches 22 and the conductive wires 24.

FIG. 7B shows the sectional view of the biometric recognition apparatus 100 according to another embodiment of the present invention, and the embodiment in FIG. 7B is similar to that shown in FIG. 7A. In the embodiment of FIG. 7B, the protection layer 60 in the biometric recognition apparatus 100 is arranged on bottommost position of the structure, while the substrate 10 is arranged on topmost position of the structure. The substrate 10 is, for example, glass substrate to provide scratchproof effect. In this embodiment, the substrate 10 may also be a polymer thin film substrate and the polymer thin film substrate is attached below the protective glass of the touch screen for biometric recognition. Moreover, the protection layer 60 has broader material choice because it does not need to have scratch-proof effect. The protection layer 60 may be an extension of the substrate of other device.

FIG. 7C shows the sectional view of the biometric recognition apparatus 100 according to another embodiment of the present invention, and the embodiment in FIG. 7C is similar to that shown in FIG. 7A. In the embodiment of FIG. 7C, the substrate 12 is metal substrate and metal substrate may be made from stainless steel, aluminum (Al), copper (Cu), iron (Fe), silver (Ag), tin (Sn), tungsten (W) or the alloy of above metals. Therefore, an insulating layer 30 is arranged between the metal substrate 12 and the reflection-shielding electrode layer 40' arranged with the selection switches 22 and the conductive wires 24. The metal substrate 12 may electrically connect with another IC (such as the biometric controller 70 shown in FIG. 3A) through a flexible circuit board.

Figure 8A:
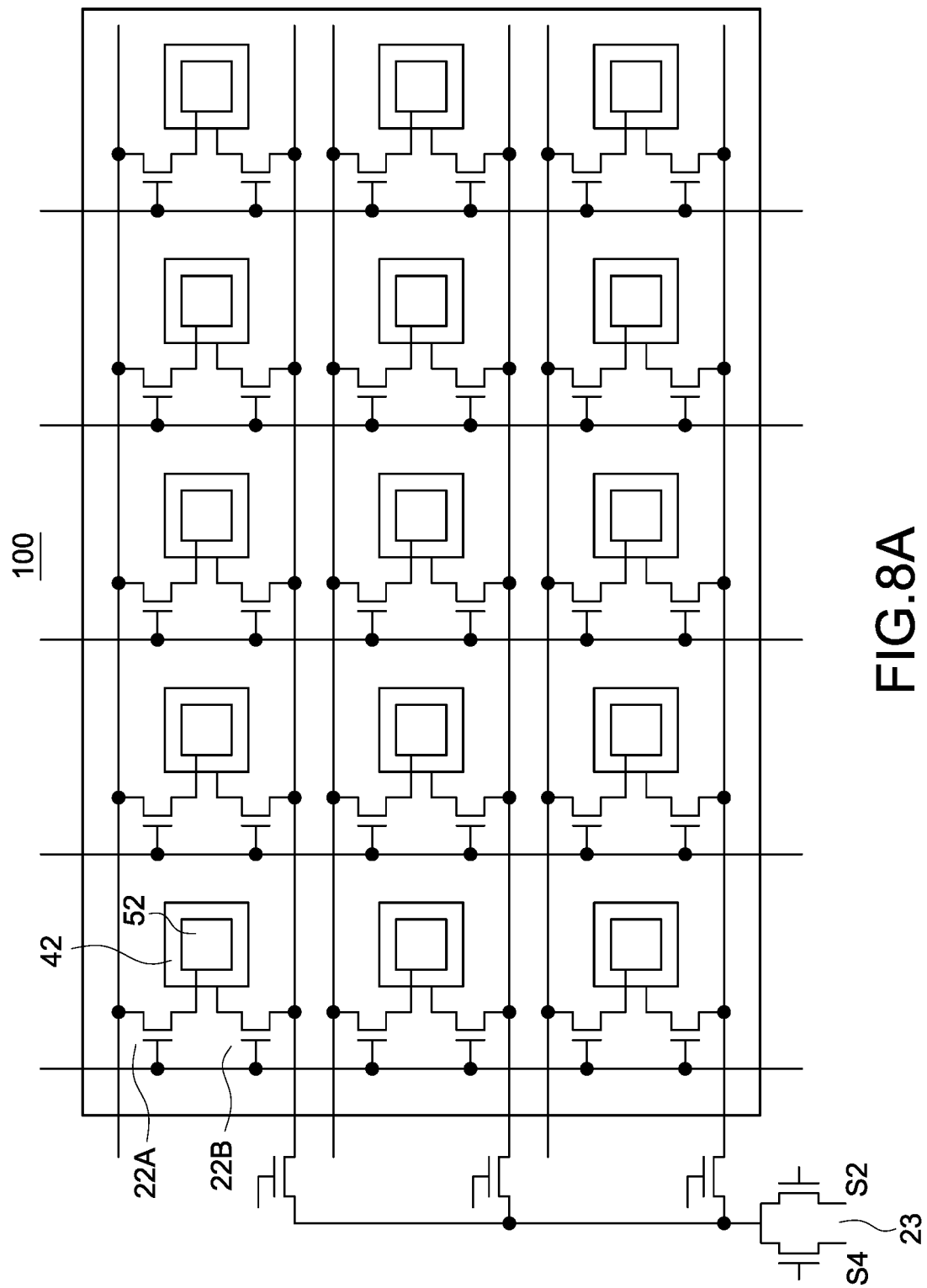
FIG. 8A is a schematic view showing the measurement operation of the biometric recognition apparatus according to the present invention.

FIG. 8A is a schematic view showing the measurement operation of the biometric recognition apparatus 100 according to the present invention, where the biometric recognition apparatus 100 is, for example, the biometric recognition apparatus 100 shown in FIGS. 2A and 3A. Namely, the reflection-shielding electrode layer 40 has a plurality of reflection-shielding electrodes 42. The sensing electrodes 52 are accessed through the first set of selection switches 22A, while the reflection-shielding electrodes 42 are accessed through the second set of selection switches 22B. Namely, the reflection-shielding electrodes 42 selectively receive the reflection-deflection signal S2 or the predetermined-level signal S4 through the second set of selection switches 22B and the signal selection switch 23. The reflection-deflection signal S2 is, for example, generated by the first signal processing circuit (such as a non-inverting amplifier) 74A shown in FIG. 3A, while the predetermined-level signal S4 is, for example, generated by the reference signal source 76 shown in FIG. 3A. The predetermined-level signal S4 may be positive level signal, negative level signal, zero level signal or alternating signal.

Figure 8B:
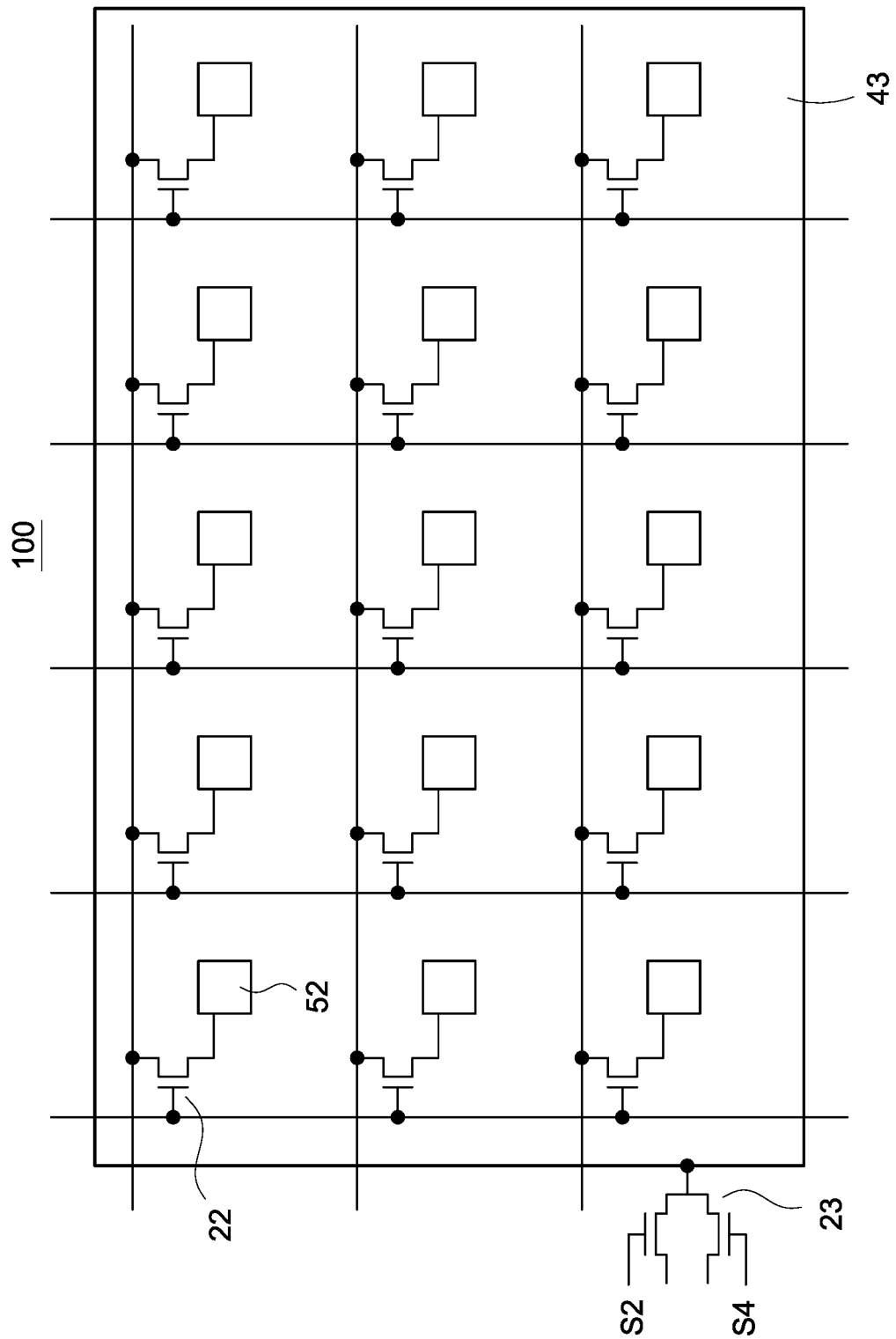
FIG. 8B is a schematic view showing the measurement operation of the biometric recognition apparatus according to the present invention.

FIG. 8B is a schematic view showing the measurement operation of the biometric recognition apparatus 100 according to the present invention, where the biometric recognition apparatus 100 is, for example, the biometric recognition apparatus 100 shown in FIGS. 2B and 3B. Namely, the reflection-shielding electrode layer 40 has only one-piece reflection-shielding electrode 43. The sensing electrodes 52 selectively receive the sensing signal Si through the selection switches 22. The one-piece reflection-shielding electrode 43 selectively receives the reflection-deflection signal S2 or the predetermined-level signal S4 through the signal selection switch 23. The reflection-deflection signal S2 is, for example, generated by the first signal processing circuit (such as a non-inverting amplifier) 74A shown in FIG. 3B, while the predetermined-level signal S4 is, for example, generated by the reference signal source 76 shown in FIG. 3B.

To sum up, the present invention has following advantages:

1. The sensing electrode has suppressing electrode surrounding and electrically isolated with the sensing electrode, and the sensing electrode layer has reflection-shielding electrode on one side thereof. The sensing sensibility and signal-to-noise ratio for the sensing circuit can be enhanced and the distance between the sensing electrode and user finger can be advantageously increased.

2. When respectively applying suitable bias to the sensing electrode, the suppressing electrode and the reflection-shielding electrodes, the electric flux lines can be concentrated on a position atop the selected sensing electrode, which is corresponding to the user finger touch position, thus further enhancing the sensing ability and signal-to-noise ratio.

3. The sensing electrode according to the present invention can be implemented in substrates (such as metal or polymer substrate) not for integrated circuit. The chip area can be reduced.

Thus, particular embodiments have been described. Other embodiments are within the scope of the following claims. For example, the actions recited in the claims may be performed in a different order and still achieve desirable results.

What is claimed is:

1. A biometric recognition apparatus with reflection-shielding electrode, comprising:
   a substrate;
   a sensing electrode layer arranged on one side of the substrate, the sensing electrode layer comprising a plurality of sensing electrodes and at least one suppressing electrode;
   a plurality of selection switches and conductive wires, at least a part of the selection switches and a part of the conductive wires electrically connected to the corresponding sensing electrodes;
   a reflection-shielding electrode layer arranged on one side of the sensing electrode layer, the reflection-shielding electrode layer having at least one reflection-shielding electrode.

2. The biometric recognition apparatus in claim 1, wherein each of the sensing electrodes is surrounded by the suppressing electrode and has a gap with the suppressing electrode.

3. The biometric recognition apparatus in claim 1, wherein the selection switches are arranged into a plurality of switch sets, each of the selection switches in one switch set is corresponding to at least one of the sensing electrodes.

4. The biometric recognition apparatus in claim 3, wherein each of the conductive wires electrically couples to at least one of the switch sets.

5. The biometric recognition apparatus in claim 1, further comprising an insulating layer arranged between the sensing electrode layer and the reflection-shielding electrode layer.

6. The biometric recognition apparatus in claim 1, wherein the selection switches and the conductive wires are arranged on one side of the reflection-shielding electrode layer and away from the sensing electrode layer; the biometric recognition apparatus further comprises an insulating layer arranged between the reflection-shielding electrode layer and the selection switches.

7. The biometric recognition apparatus in claim 1, wherein the selection switches and the conductive wires are arranged on the reflection-shielding electrode layer.

8. The biometric recognition apparatus in claim 1, wherein the selection switch is field effect transistor (FET) switch.

9. The biometric recognition apparatus in claim 8, wherein the FET switch is arranged on the substrate.

10. The biometric recognition apparatus in claim 9, further comprising a biometric controller formed atop the substrate.

11. The biometric recognition apparatus in claim 1, wherein the selection switch is thin film transistor (TFT) switch.

12. The biometric recognition apparatus in claim 11, wherein the TFT switch is arranged on the substrate.

13. The biometric recognition apparatus in claim 1, further comprising a biometric controller packaged into an integrated circuit (IC) chip, the IC chip is bonded or press-welded on the substrate.

14. The biometric recognition apparatus in claim 1, further comprising a biometric controller packaged into an integrated circuit (IC) chip, the IC chip is bonded or press-welded on a circuit board and the IC chip electrically connects with the substrate through a flexible circuit board.

15. The biometric recognition apparatus in claim 1, wherein the substrate is made from glass, polymer thin film, metal, silicon or silicon compound.

16. The biometric recognition apparatus in claim 1, wherein the sensing electrode is of circular, rhombic, square, rectangular or polygonal shape.

17. A sensing method for a biometric recognition apparatus, the biometric recognition apparatus comprising a plurality of sensing electrodes, at least one suppressing electrode, at least one reflection-shielding electrode, a plurality of selection switches and at least one signal processing circuit, the method comprising:
controlling the selection switches to sequentially or randomly set at least one of the sensing electrode as a detecting electrode;
generating a periodic or non-periodic fingerprint sensing signal and sending the fingerprint sensing signal to the selected detecting electrode to generate a sensed signal;
using the signal processing circuit to process the sensed signal into a reflection-deflection signal having a same phase with the sensed signal and coupling the reflection-deflection signal to the at least one reflection-shielding electrode; and
coupling a suppressing signal to the suppressing electrode.

18. The method in claim 17, wherein the suppressing signal is generated by processing the sensed signal with another signal processing circuit and has inverted phase with the sensed signal.

19. The method in claim 17, wherein the suppressing signal is a predetermined-level signal.

20. The method in claim 17, further comprising: periodically or randomly coupling predetermined-level signals to the sensing electrodes, the reflection-shielding electrode and the suppressing electrode.

* * * * *